United States Patent
Adler et al.

(10) Patent No.: US 7,078,689 B1
(45) Date of Patent: Jul. 18, 2006

(54) INTEGRATED ELECTRON BEAM AND CONTAMINANT REMOVAL SYSTEM

(75) Inventors: David L. Adler, San Jose, CA (US); Mehran Nasser-Ghodsi, Hamilton, MA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 0 days.

(21) Appl. No.: 11/016,074

(22) Filed: Dec. 17, 2004

Related U.S. Application Data

(60) Provisional application No. 60/621,989, filed on Oct. 25, 2004.

(51) Int. Cl.
*H01J 37/30* (2006.01)
*H01L 21/66* (2006.01)

(52) U.S. Cl. ............... 250/306; 250/307; 250/310; 250/311; 250/431; 250/443.1; 438/14

(58) Field of Classification Search ............ None
See application file for complete search history.

(56) References Cited

U.S. PATENT DOCUMENTS

| | | | | |
|---|---|---|---|---|
| 5,554,854 A | * | 9/1996 | Blake | 250/492.21 |
| 5,633,506 A | * | 5/1997 | Blake | 250/492.21 |
| 6,221,169 B1 | * | 4/2001 | Bernstein et al. | 134/2 |
| 6,427,703 B1 | * | 8/2002 | Somekh | 134/1.1 |
| 6,753,194 B1 | * | 6/2004 | Ushiki et al. | 438/14 |
| 2002/0053353 A1 | * | 5/2002 | Kawata et al. | 134/1.3 |

FOREIGN PATENT DOCUMENTS

| WO | WO 00/19518 | 4/2000 |
|---|---|---|
| WO | WO 01/59831 A2 | 8/2001 |

\* cited by examiner

*Primary Examiner*—Nikita Wells
(74) *Attorney, Agent, or Firm*—Okamoto & Benedicto LLP

(57) ABSTRACT

One embodiment disclosed relates to an integrated electron beam inspection and contaminant removal tool. An electron beam column is configured to image an area on a substrate being inspected. A contaminant removal subsystem is integrated with the electron beam column and configured to remove contamination from a surface of the substrate. Means is advantageously included by which the substrate is kept from being exposed to air between the contaminant removal subsystem and the electron beam column.

23 Claims, 8 Drawing Sheets

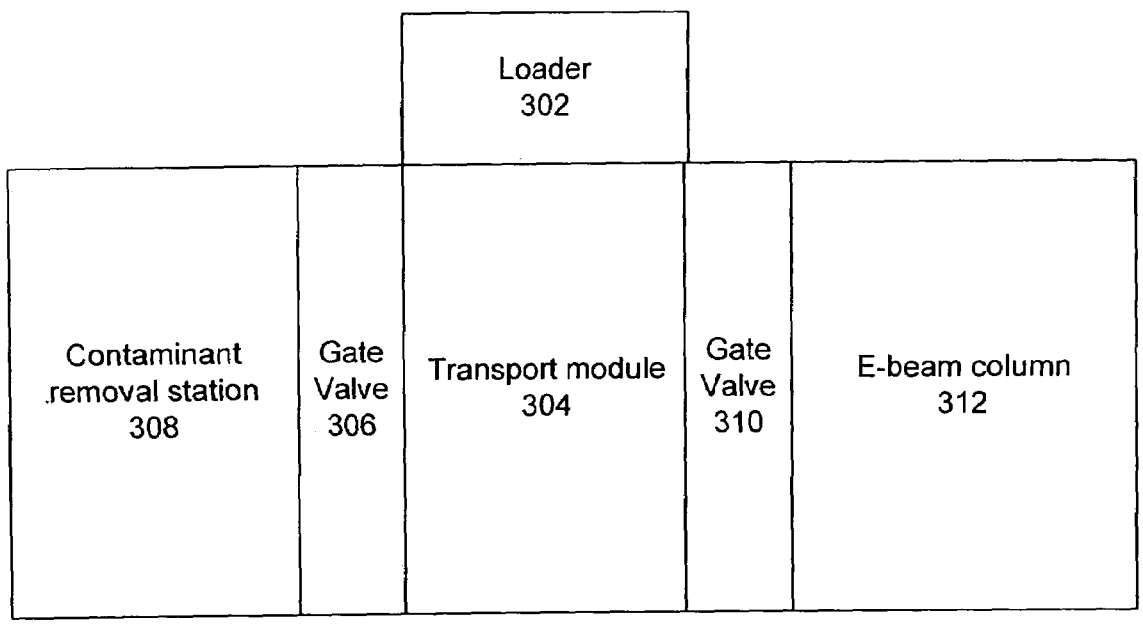
FIG. 3        300

INTEGRATED ELECTRON BEAM AND CONTAMINANT REMOVAL SYSTEM

CROSS-REFERENCE TO RELATED APPLICATIONS

The present invention claims the benefit of U.S. Provisional Patent Application No. 60/621,989, entitled "Integrated Electron Beam and Contaminant Removal System," filed Oct. 25, 2004 by inventors David L. Adler and Mehran Nasser-Ghodsi, the disclosure of which is hereby incorporated by reference.

BACKGROUND OF THE INVENTION

1. Field of the Invention

The present invention relates to apparatus and methods for particle beam systems.

2. Description of the Background Art

Organic and other contaminants can adversely affect the measurement accuracy, inspection and review data, and other information received from a scanning electron microscope (SEM) or similar apparatus. This is true even when the organic contaminants are present only at low levels. In addition, contaminants can adversely reduce the lifetime of key electron beam (e-beam) tool components and increase the frequency at which such tools need servicing.

A conventional method 100 for semiconductor manufacturing, including a level of contaminant removal, is shown in the flow chart of FIG. 1. A semiconductor wafer is provided (102) in a "clean room" environment, and the wafer is cleaned (104) at a contaminant removal station to remove contaminants thereon. Thereafter, the wafer goes through various process steps. These process steps may include, for example, various deposition, lithography, etching, and other steps. After one or more of these process steps (106) (i.e. at some point during the process), it may be desired to inspect the wafer to check for defects or to gather other information. The wafer is then transported (108) to an e-beam inspection station. This transportation (108) is generally performed within the clean room environment to avoid undue contamination. The e-beam inspection station may comprise, for example, a tool based on an SEM. At the e-beam inspection station, the wafer may be scanned or otherwise inspected (110). Thereafter, the manufacturing process may continue with further process steps (112) and so on. Each time e-beam inspection is performed, the wafer is typically exposed but in the clean room environment.

SUMMARY

One embodiment of the invention relates to an integrated electron beam inspection and contaminant removal tool. An electron beam column is configured to image an area on a substrate being inspected. A contaminant removal subsystem is integrated with the electron beam column and configured to remove contamination from a surface of the substrate. Means is advantageously included by which the substrate is kept from being exposed to air between the contaminant removal subsystem and the electron beam column.

Another embodiment relates to a method of manufacturing a semiconductor wafer. The wafer is processed with at least one manufacturing process step, and the wafer is loaded into an integrated e-beam inspection and contaminant removal apparatus. Contaminants are removed from a surface of the wafer, and the wafer is inspected using an electron beam. The wafer is advantageously kept from being exposed to air between the contaminant removal and the electron beam inspection.

BRIEF DESCRIPTION OF THE DRAWINGS

FIG. 3 is a schematic diagram showing components of an e-beam inspection system with an integrated contaminant removal station in accordance with an embodiment of the invention.

The above-described diagrams are not necessarily to scale and are intended be illustrative and not limiting to a particular implementation.

DETAILED DESCRIPTION

The above-discussed conventional method 100 generally relies on the fact that the substrate is maintained in a relatively clean state as a result of the manufacturing process being performed in a clean room environment. However, residual contamination may still be present and adversely affect measurement accuracy, inspection or review image data, and other information received from an SEM tool or similar tool. The present invention provides methods and apparatus wherein residual contamination is cleaned so as to reduce these adverse effects during inspection or review of the wafer.

Figure 1:
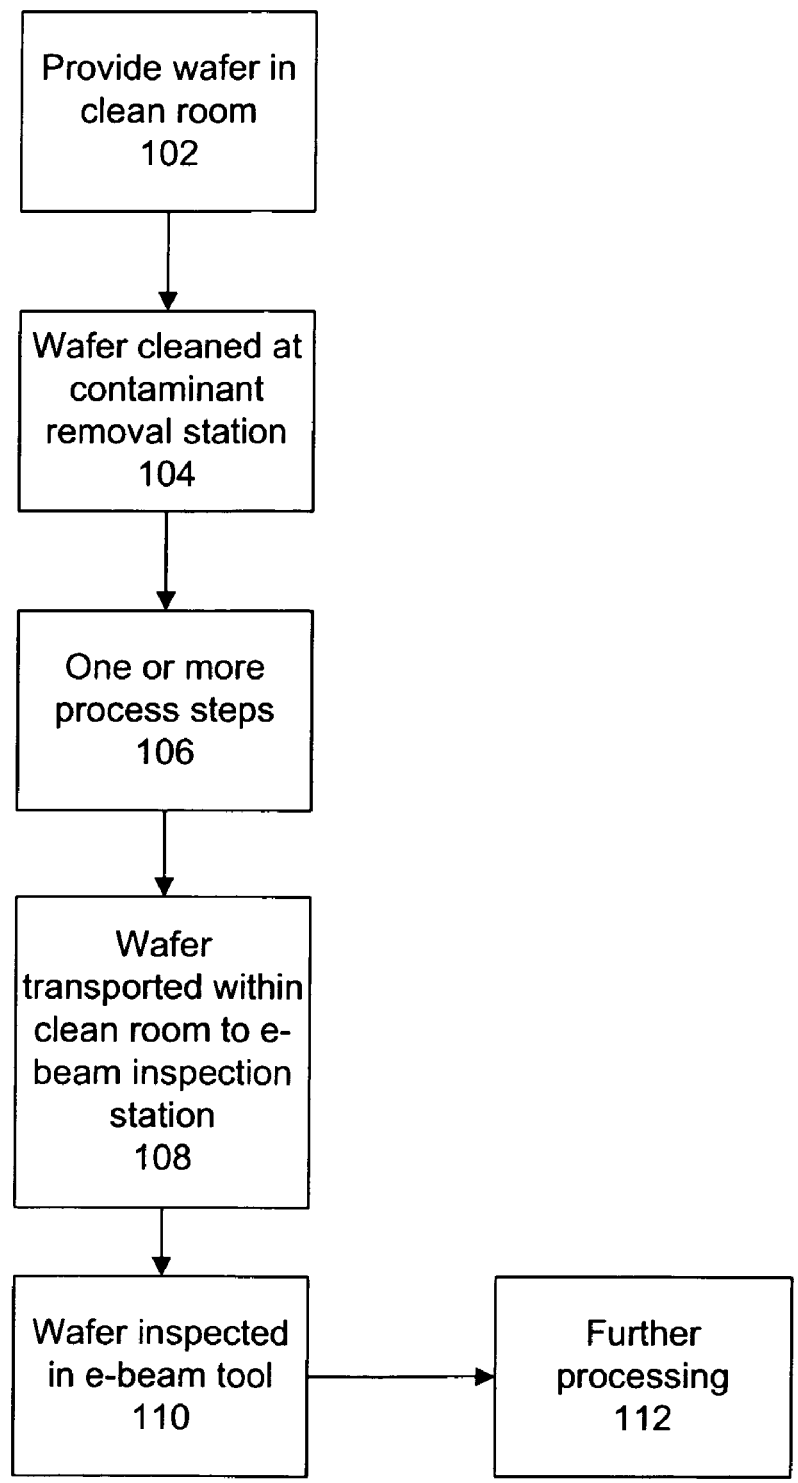
FIG. 1 is a flow chart depicting a conventional method for semiconductor manufacturing including e-beam inspection.
Figure 2A:
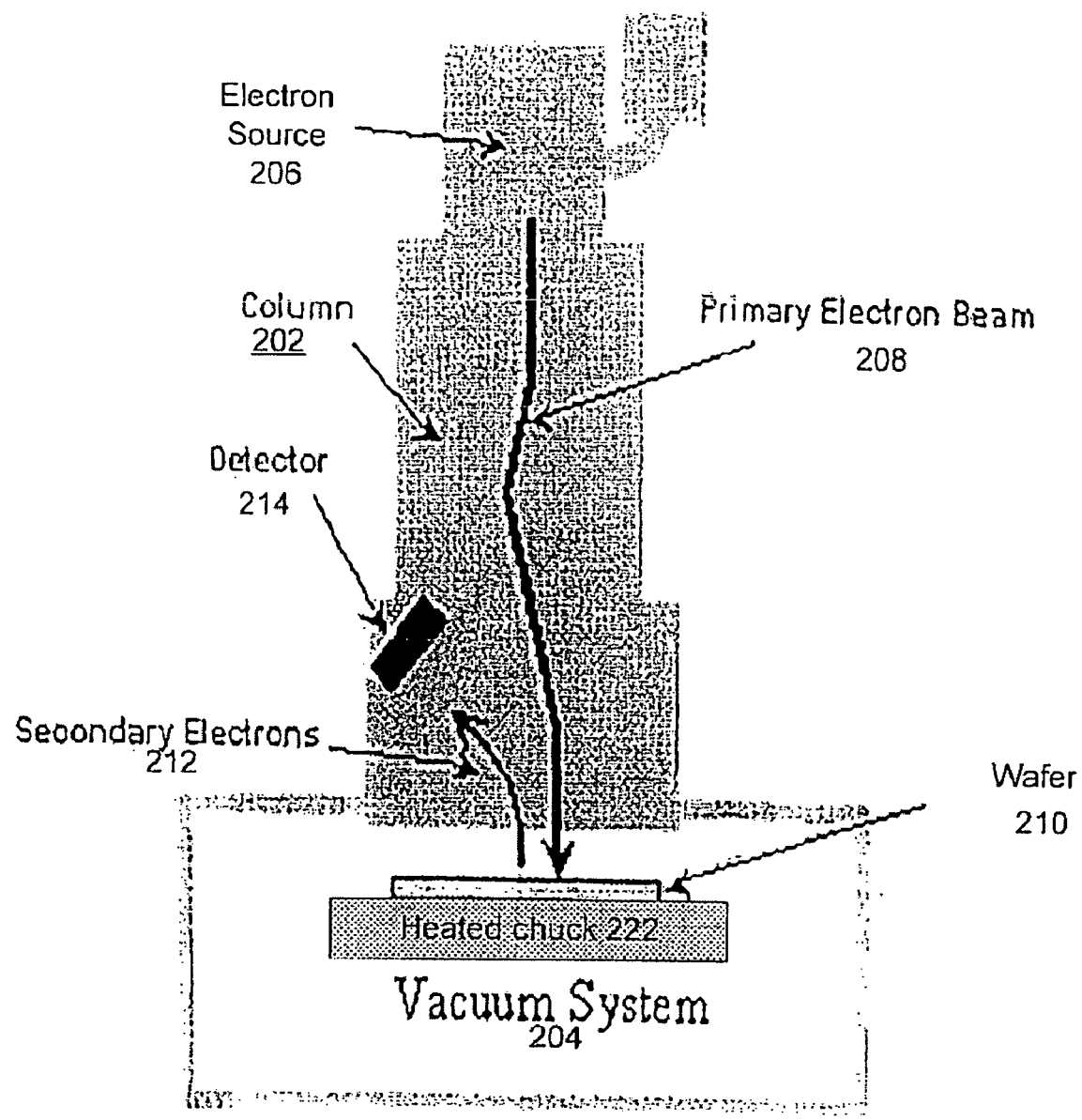
FIG. 2A is a schematic diagram of an electron beam inspection system in accordance with an embodiment of the invention.

FIG. 2A is a schematic diagram of an electron beam inspection system 200 in accordance with an embodiment of the invention. The e-beam system 200 generates and directs an incident or primary electron beam 208 towards an area of interest on a wafer (or other substrate) 210 for use in generating an image of the area.

As shown in FIG. 2A, the incident beam 208 may be generated by an electron gun or other source 206. A column 202 including various components in a vacuum is used to direct the primary electron beam 208 towards the surface of the wafer 210. The column 202 typically includes various electron lenses, apertures, and other components.

In accordance with an embodiment of the invention, the wafer 210 may be held on a heated chuck or stage 222. The heated stage 222 may be advantageously controlled so as to heat the wafer 210 for the removal of contaminant therefrom while the wafer 210 is in-situ in the e-beam inspection machine.

Like the column 202, because the incident beam comprises electrons, a vacuum system 204 is used to pump the chamber containing the wafer 210 and heated stage 222 (as well as the column 202). A wafer transport system (not shown) may be used to move wafers to be inspected in-line as part of a manufacturing process.

The e-beam system 200 also includes a detector 214 to detect secondary electrons 212 (and/or backscattered electrons) emitted from the sample. The e-beam system 200 may also include an image generator (not shown) for forming an image from the detected emitted particles.

Figure 2B:
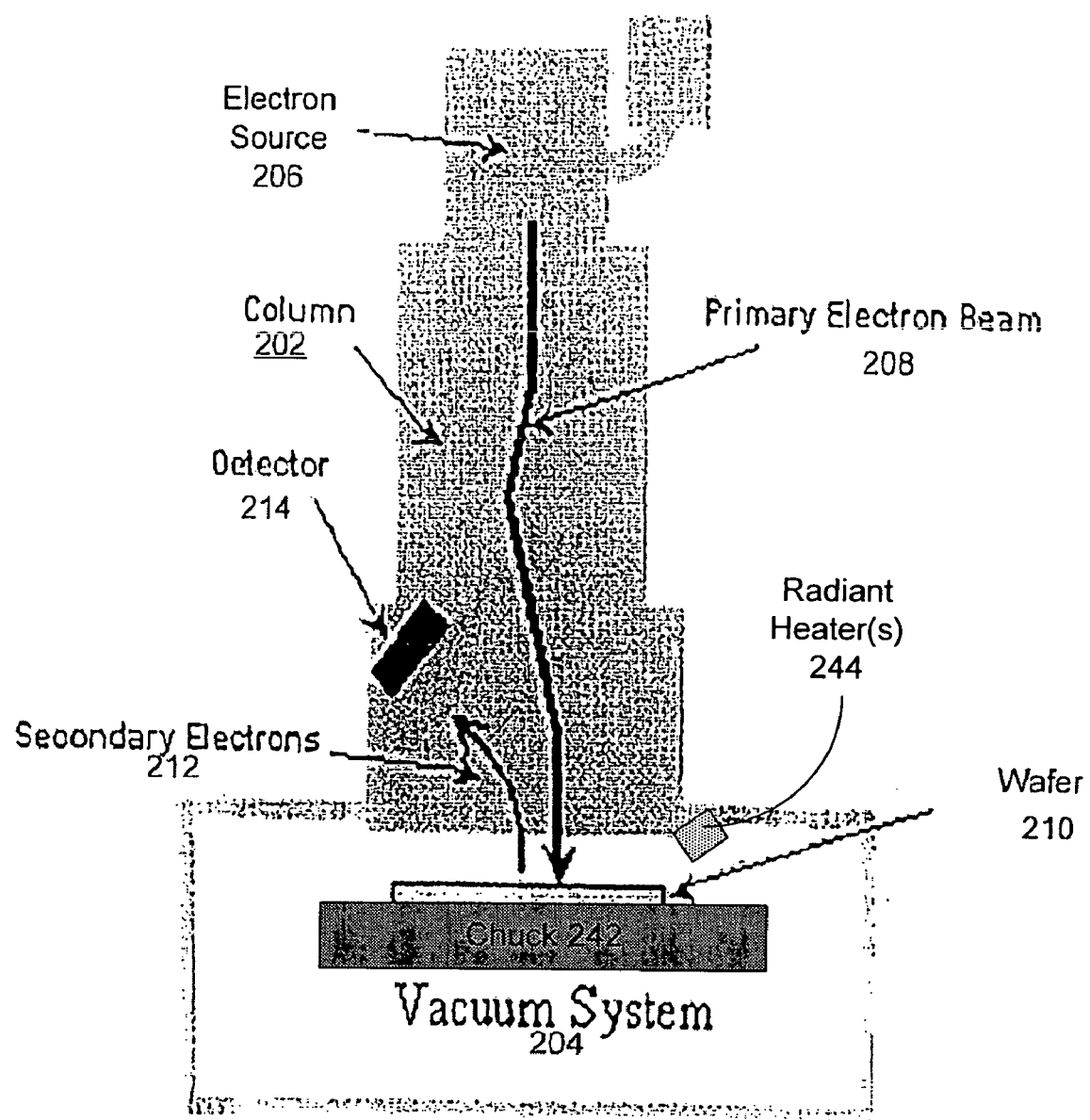
FIG. 2B is a schematic diagram of an electron beam inspection system in accordance with another embodiment of the invention.

FIG. 2B is a schematic diagram of an electron beam inspection system 240 in accordance with another embodiment of the invention. The e-beam system 240 of FIG. 2B is similar to the e-beam system 200 of FIG. 2A with the following differences. First, instead of a heated stage 222, the e-beam system 240 of FIG. 2B may include a non-heated chuck or stage 242. Controllable heating is instead provided for by one or more radiant heaters 244. The radiant heater(s) 244 may be advantageously controlled so as to heat the wafer 210 for the removal of contaminant therefrom while the wafer 210 is in-situ in the e-beam inspection machine. In this embodiment, the chuck or stage 242 may act as a heat sink to cool the wafer back down after the in-situ contaminant removal.

Figure 2C:
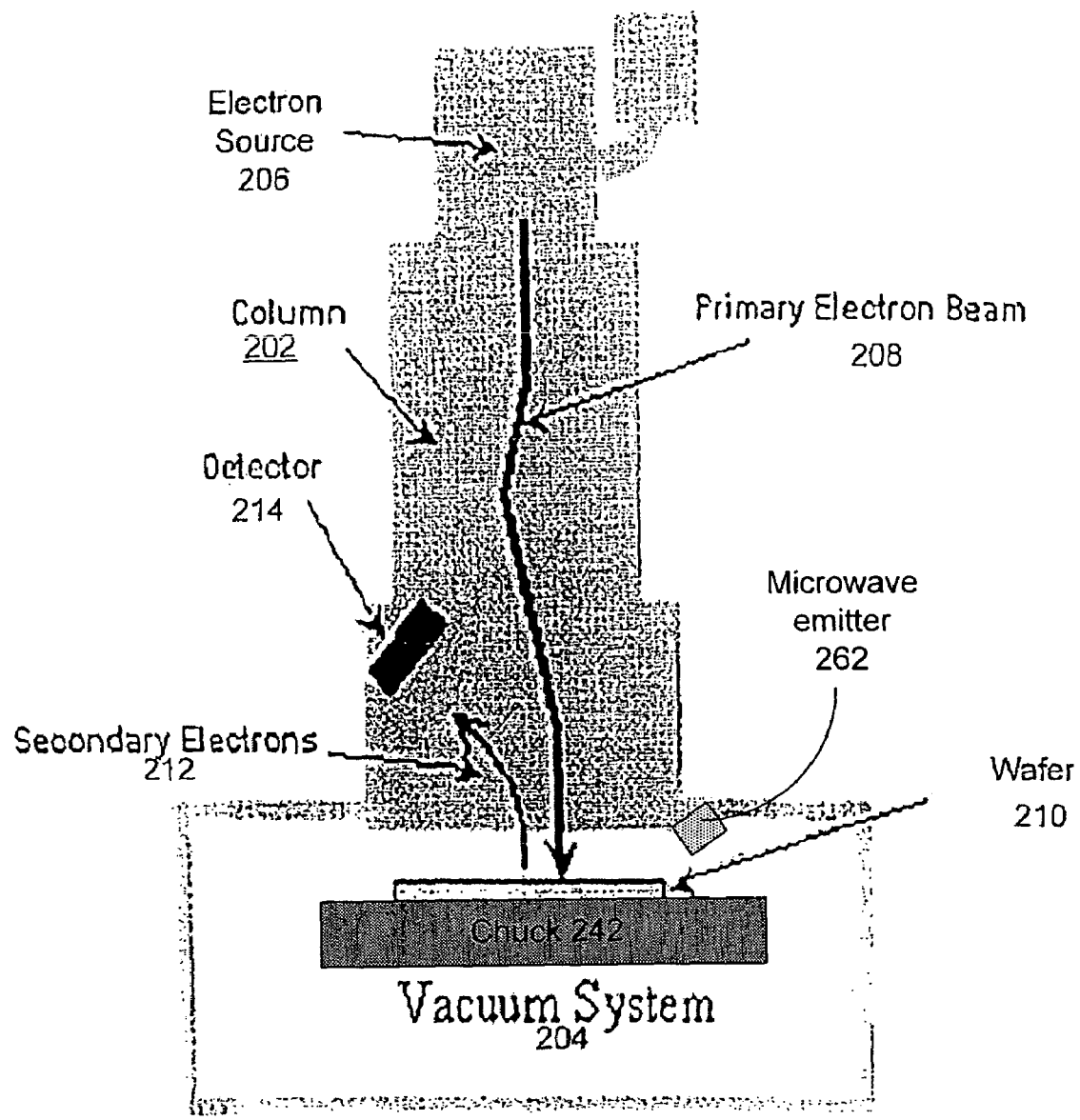
FIG. 2C is a schematic diagram of an electron beam inspection system in accordance with another embodiment of the invention.

FIG. 2C is a schematic diagram of an electron beam inspection system 260 in accordance with another embodiment of the invention. The e-beam system 260 of FIG. 2C is similar to the e-beam system 240 of FIG. 2B. However, instead of the radiant heater(s) 244, the e-beam system 260 of FIG. 2C includes one or more microwave emitters or radiators 262. The microwave emitters or radiators 262 may be configured to advantageously excite molecules in the surface contaminants and lead to their removal from the wafer surface.

FIG. 3 is a schematic diagram showing components of an e-beam inspection system 300 with an integrated contaminant removal station in accordance with an embodiment of the invention. A wafer loader 302 receives a semiconductor wafer being processed (or other substrate for inspection) into the system 300.

The loader 302 transfers the wafer to the transport module 304. The transport module 304 includes mechanisms, such a robot arms or similar mechanisms, for moving the wafer mechanically into and out of the contaminant removal station 308 and into and out of the e-beam column 312. A first gate valve 306 may be configured to atmospherically separate the transport module 304 from the contaminant removal station 308, and a second gate valve 310 may be configured to atmospherically separate the transport module 304 from the e-beam column 312.

When moving the wafer between the transport module 304 and the contaminant removal station 308, the first gate valve 306 is opened while the second gate valve 310 remains closed and sealed. This enables the vacuum of the e-beam column 312 to remain undisturbed during such transportation. On the other hand, when moving the wafer between the transport module 304 and the e-beam column 312, the first gate valve 306 may be closed while the second gate valve 310 is opened. This minimizes the disturbance to the vacuum of the e-beam column 312 during such transportation.

Here, the cleaning of the substrate surface is performed while outside the SEM vacuum. This is advantageous in that contamination of the SEM column is avoided.

Figure 4A:
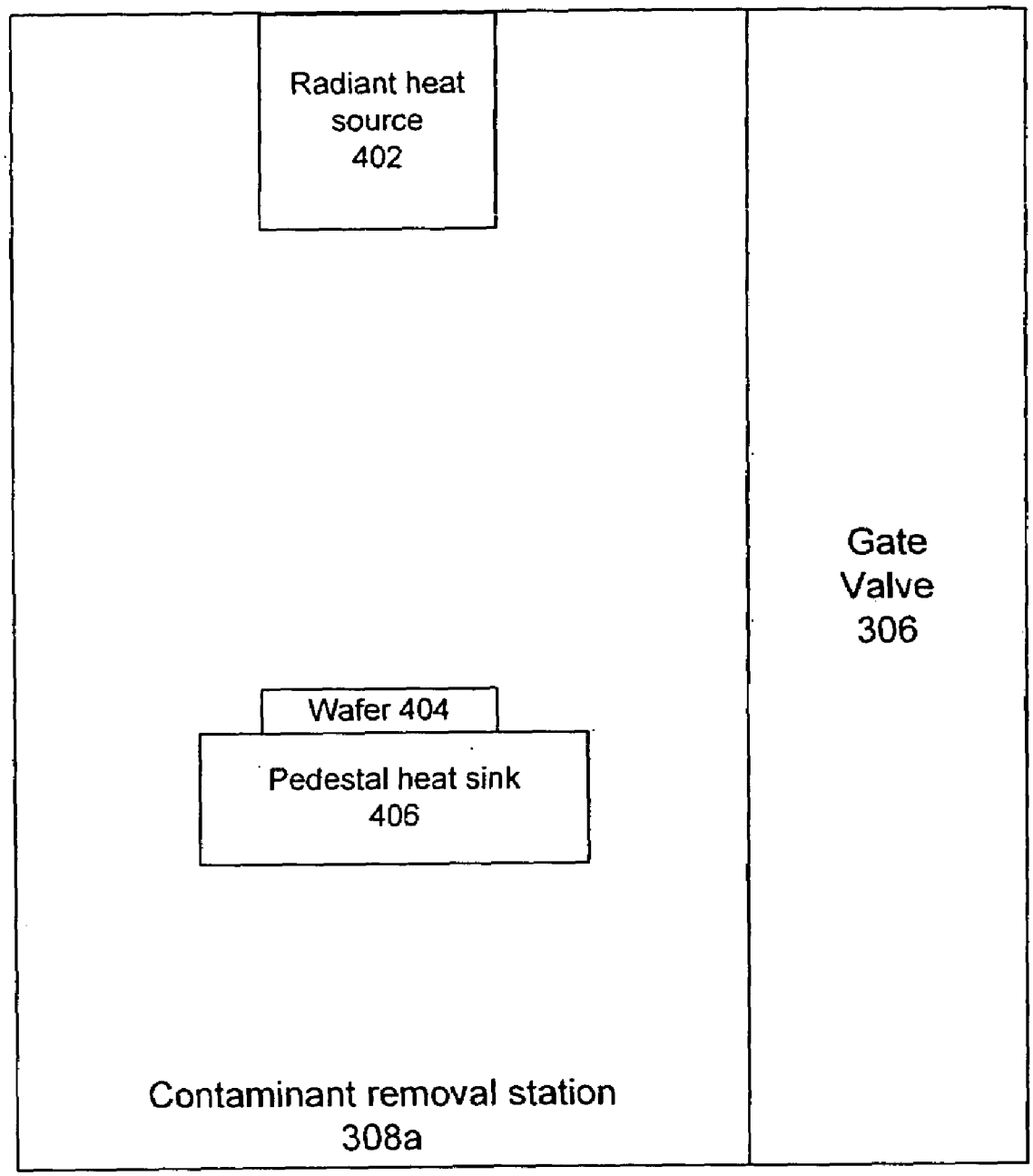
FIG. 4A is a schematic diagram depicting the contaminant removal station in accordance with an embodiment of the invention.

FIG. 4A is a schematic diagram depicting the contaminant removal station 308a in accordance with an embodiment of the invention. In this embodiment, the contaminant removal station 308a includes a radiant heat source 402.

After the wafer 404 is moved via the first gate valve 306 into the station 308a and onto the pedestal 406, the radiant heat source 402 is controlled to heat up the wafer 404 so as to remove contamination from the surface thereof. During the heating for contamination removal, the station 308a may be preferably in a vacuum or under flow of inert gas to facilitate removal of contaminants. The pedestal 406 is configured to also function as a heat sink to cool the wafer back down after the contaminant removal.

Figure 4B:
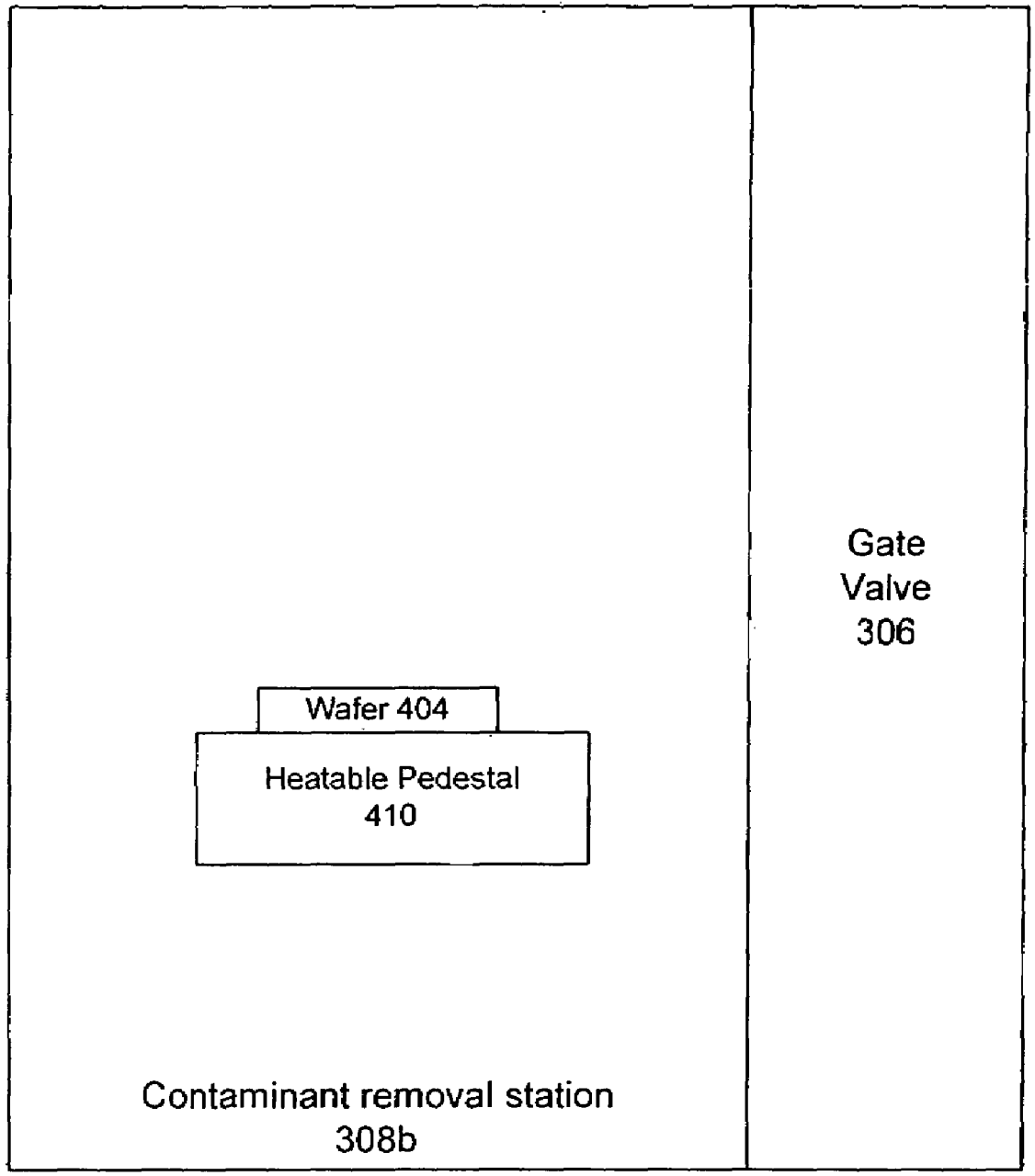
FIG. 4B is a schematic diagram depicting the contaminant removal station in accordance with another embodiment of the invention.

FIG. 4B is a schematic diagram depicting the contaminant removal station 308b in accordance with another embodiment of the invention. The contaminant removal station 308b of FIG. 4B is similar to the station 308a of FIG. 4A with the following differences. The heating in the station 308b of FIG. 4B is performed by way of a heatable pedestal 410. The heatable pedestal 410 is controlled so as to heat said wafer so as to facilitate removal of contaminants from the surface thereof.

FIG. 4B is a schematic diagram depicting the contaminant removal station 308b in accordance with another embodiment of the invention. The contaminant removal station 308b of FIG. 4B is similar to the station 308a of FIG. 4A with the following differences. The heating in the station 308b of FIG. 4B is performed by way of a heatable pedestal 410. The heatable pedestal 410 is controlled so as to heat said wafer so as to facilitate removal of contaminants from the surface thereof.

Figure 4C:
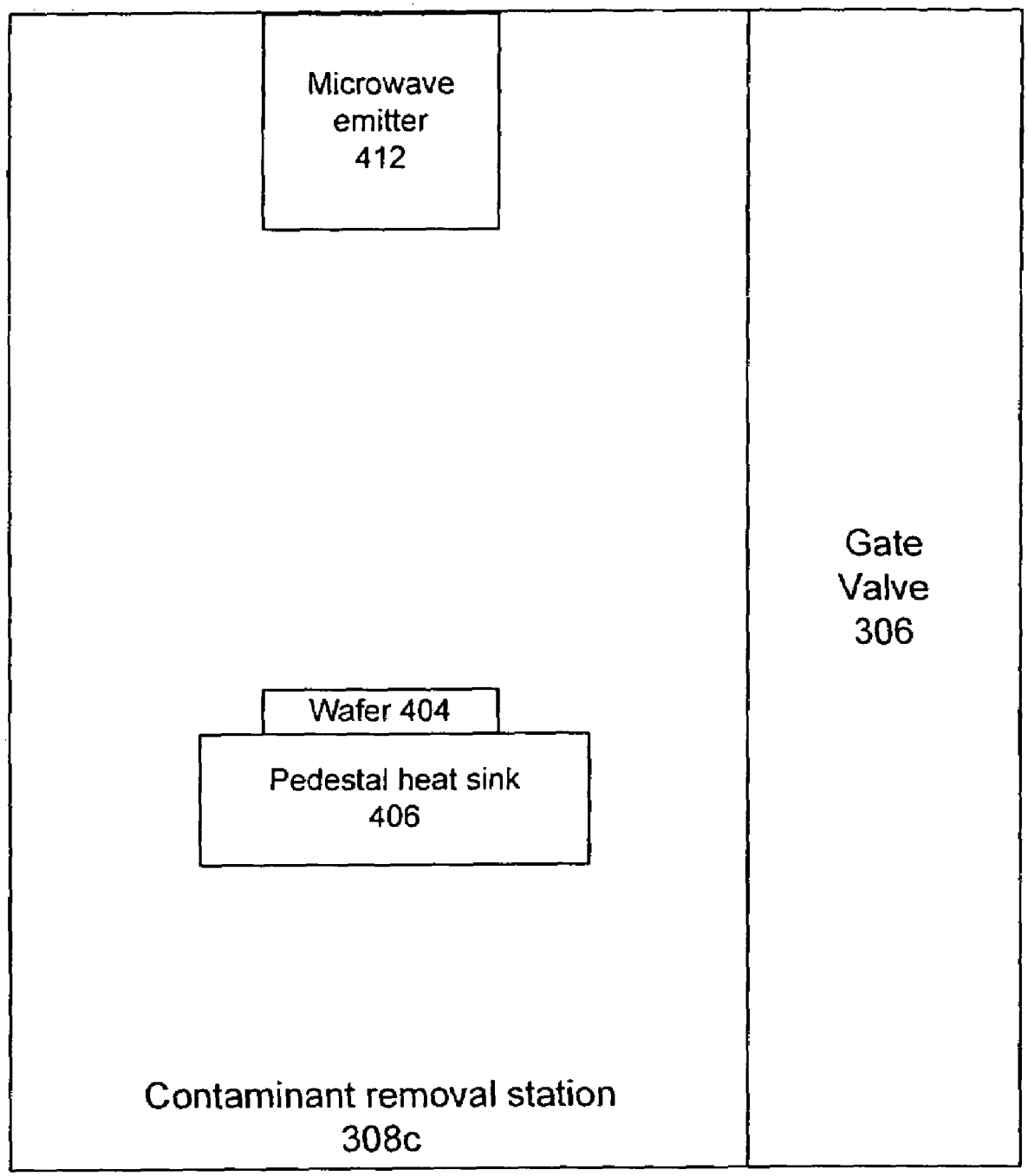
FIG. 4C is a schematic diagram depicting the contaminant removal station in accordance with another embodiment of the invention.

FIG. 4C is a schematic diagram depicting the contaminant removal station 308c in accordance with another embodiment of the invention. The contaminant removal station 308c of FIG. 4C is similar to the station 308a of FIG. 4A with the following differences. The station 308c of FIG. 4C utilizes a microwave emitter or radiator 412 (instead of a radiant heater 402). The microwave emitter or radiator 412 is controlled so as to flood said wafer surface with microwave radiation so as to facilitate removal of contaminants therefrom.

As discussed above, embodiments of the present invention rely on a contaminant removal station which is closely associated with the e-beam tool or that is provided within the e-beam tool. The contaminant removal may occur just prior to placing the substrate under the SEM column, or may actually be performed while the substrate is under the SEM column.

In alternate embodiments, combinations of the above-described embodiments may be employed. For example, both radiative heating and microwave radiation may be employed together so as to further facilitate removal of surface contaminants.

While a preferred embodiment of the present invention is utilized for pre-cleaning a substrate in the context of an SEM-based inspector or review tool, other embodiments may use other non-SEM tools. For example, another embodiment may integrate contaminant removal with a projection (nonscanning) electron microscope, or another particle beam based system.

Advantageously, embodiments of the invention should provide superior accuracy in inspection or metrology results, since a cleaner surface will be imaged or measured. Embodiments of the invention may also make it easier to maintain the SEM or other particle-beam apparatus, since cleaner wafer surfaces will produce less contamination in the apparatus. For this reason, maintenance costs of these apparatus may also be advantageously reduced.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An integrated electron beam inspection and contaminant removal apparatus, the apparatus comprising:
    an electron beam column configured to image an area on a substrate being inspected;
    a contaminant removal subsystem integrated with the electron beam column and configured to remove contamination from a surface of the substrate;
    a transport module configured to move the substrate into and out of the electron beam column and to move the substrate into and out of the contaminant removal subsystem:
    a first gate valve configured between the transport module and the contaminant removal subsystem; and
    a second gate valve configured between the transport module and the electron beam column.

2. The apparatus of claim 1, when moving the substrate between the transport module and the contaminant removal subsystem, the first gate valve is opened while the second gate valve remains closed and sealed.

3. The apparatus of claim 2, when moving the substrate between the transport module and the electron beam column, the first gate valve is closed and the second gate valve is opened.

4. The apparatus of claim 1, further comprising a vacuum system for both the electron beam column and the contaminant removal subsystem.

5. The apparatus of claim 1, wherein the contaminant removal subsystem comprises a heatable stage configured to hold and controllably heat the substrate.

6. The apparatus of claim 1, wherein the contaminant removal subsystem comprises radiant heater configured to controllably heat the surface of the substrate.

7. The apparatus of claim 1, wherein the contaminant removal subsystem comprises a microwave emitter configured to flood microwave radiation over the surface of the substrate.

8. The apparatus of claim 1, wherein the contaminant removal station comprises at least two devices of a group of devices consisting of a heatable stage, a radiant heater, and a microwave emitter.

9. The apparatus of claim 1, wherein the substrate is maintained in a vacuum during removal of contaminants.

10. The apparatus of claim 1, wherein the substrate is maintained in an inert atmosphere during removal of contaminants.

11. The apparatus of claim 1, wherein the electron beam column comprises a scanning electron microscope.

12. The apparatus of claim 1, wherein the electron beam column comprises a projection electron microscope.

13. A method of manufacturing a semiconductor wafer, the method comprising:
    processing the wafer with at least one manufacturing process step;
    loading the wafer into an integrated e-beam inspection and contaminant removal apparatus having an e-beam chambern and a contaminant removal chamber;
    opening a first gate valve to the contaminant removal chamber while keeping closed a second gate valve to the e-beam chamber;
    moving the wafer into the contaminant removal station;
    removing contaminants from a surface of the wafer;
    keeping closed the first gate valve to the contaminant removal chamber while opening the second gate valve to the e-beam chamber;
    moving the wafer into the e-beam chamber; and
    inspecting the wafer using an electron beam,
    wherein the wafer is kept from being exposed to air between the contaminant removal and the electron beam inspection.

14. The method of claim 13, wherein the wafer is kept from being exposed to air using a same vacuum system for both the contaminant removal and the electron beam inspection.

15. The method of claim 13, wherein the contaminant removal is performed using a heatable stage configured to hold and controllably heat the wafer.

16. The method of claim 13, wherein the contaminant removal is performed using a radiant heater configured to controllably heat the surface of the wafer.

17. The method of claim 13, wherein the contaminant removal is performed using a microwave emitter configured to flood microwave radiation over the surface of the wafer.

18. The method of claim 13, wherein the contaminant removal is performed using at least two devices of a group of devices consisting of a heatable stage, a radiant heater, and a microwave emitter.

19. The method of claim 13, wherein the wafer is maintained in a vacuum during removal of contaminants.

20. The method of claim 13, wherein the wafer is maintained in an inert atmosphere during removal of contaminants.

21. The method of claim 13, wherein the e-beam inspection is performed using a scanning electron microscope.

22. The method of claim 13, wherein the e-beam inspection is performed using a projection electron microscope.

23. An integrated electron beam inspection and contaminant removal tool, the tool comprising:
    an electron beam column configured to image an area on a substrate being inspected;
    a contaminant removal subsystem integrated with the electron beam column and configured to remove contamination from a surface of the substrate; and
    a plurality of gate valves configured to prevent the substrate from being exposed to air between the contaminant removal subsystem and the electron beam column.

* * * * *